United States Patent [19]
Porterfield et al.

[11] Patent Number: 4,543,705
[45] Date of Patent: Oct. 1, 1985

[54] AXIAL-LEAD COMPONENT SEQUENCING AND INSERTING APPARATUS

[75] Inventors: Richard Porterfield, Chenango Bridge, N.Y.; Henry J. Soth, Brackney; Douglas A. Biesecker, Clark Summit, both of Pa.

[73] Assignee: Universal Instruments Corporation, Binghamton, N.Y.

[21] Appl. No.: 642,650

[22] Filed: Aug. 20, 1984

[51] Int. Cl.[4] .............................................. H05K 13/04
[52] U.S. Cl. ................................. 29/566.3; 29/33 M; 29/564.6; 29/738; 227/5; 227/2
[58] Field of Search .............. 29/33 M, 837, 838, 839, 29/741, 564.6, 564.8, 566.3; 227/66, 76, 98, 103, 5, 2, 109, 90; 140/105

[56] References Cited

U.S. PATENT DOCUMENTS

| | | | |
|---|---|---|---|
| Re. 27,968 | 4/1974 | Ragard et al. | 227/2 |
| 3,455,493 | 7/1969 | Ackerman et al. | 227/90 |
| 3,539,086 | 11/1970 | Ragard et al. | 227/90 |
| 3,783,488 | 1/1974 | Ragard et al. | 227/5 |
| 4,417,683 | 11/1983 | Lewis et al. | 227/109 |
| 4,470,182 | 9/1984 | Zemek et al. | 227/109 |
| 4,507,862 | 4/1985 | Kukowski et al. | 29/837 |

*Primary Examiner*—Donald R. Schran
*Attorney, Agent, or Firm*—Fidelman, Wolffe Waldron

[57] ABSTRACT

The present invention involves a method and apparatus for feeding axial lead components directly from a sequencer to an insertion head, while eliminating direct supplying of components to the insert head via a prededicated inventory such as reeled tapes or films having components attached thereto in a predetermined sequence. Preferably, an endless chain conveyor carries the components to the insert head in chain clips which positively retain the leads thereof while allowing centering of the bodies and electrical function testing of the components just prior to insertion of the leads into corresponding holes of a circuit board. Direct supply from a sequencer having a series of individually and programmably controlled dispenser heads provides for quick and flexible variation of an input sequence without manual intervention.

30 Claims, 22 Drawing Figures

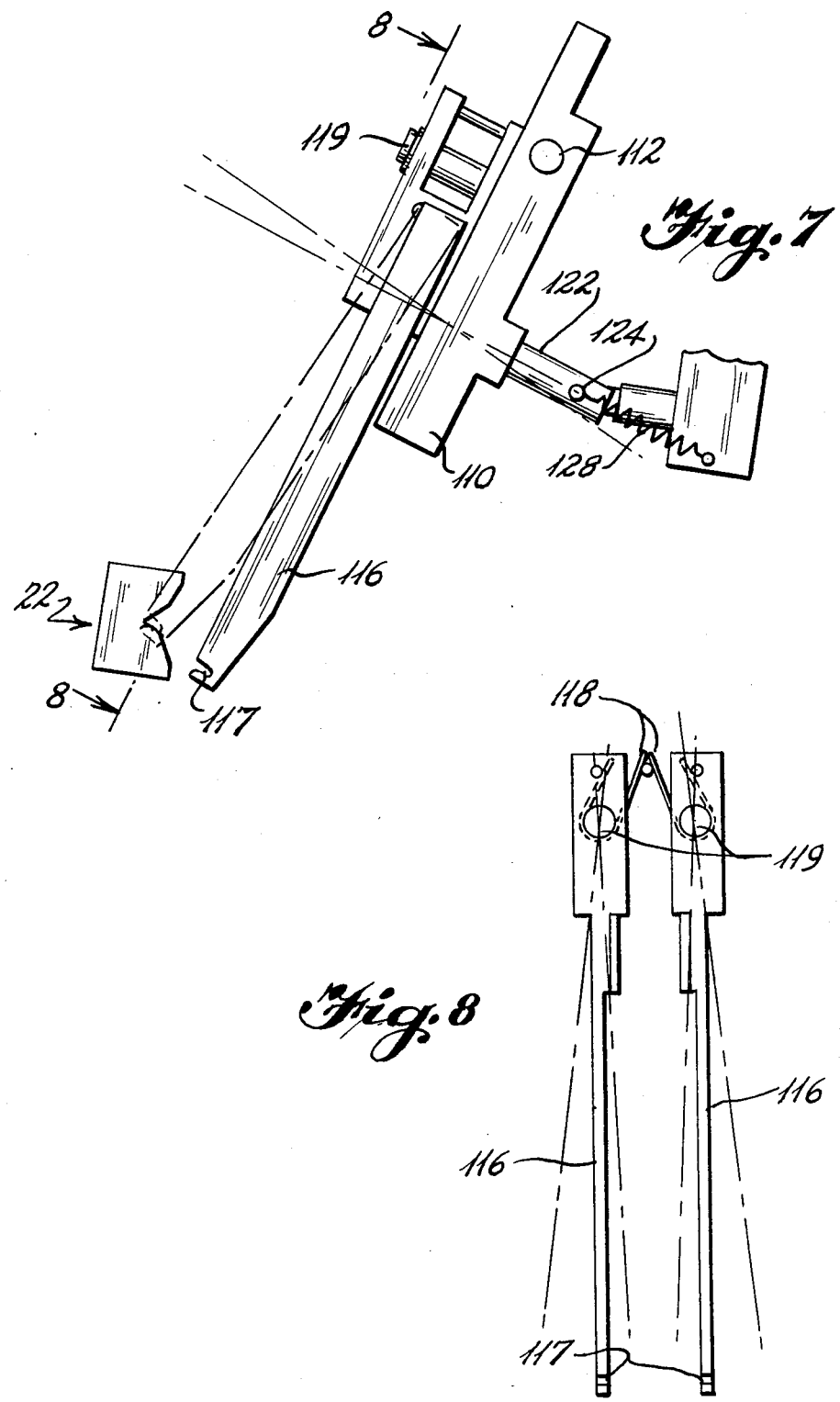

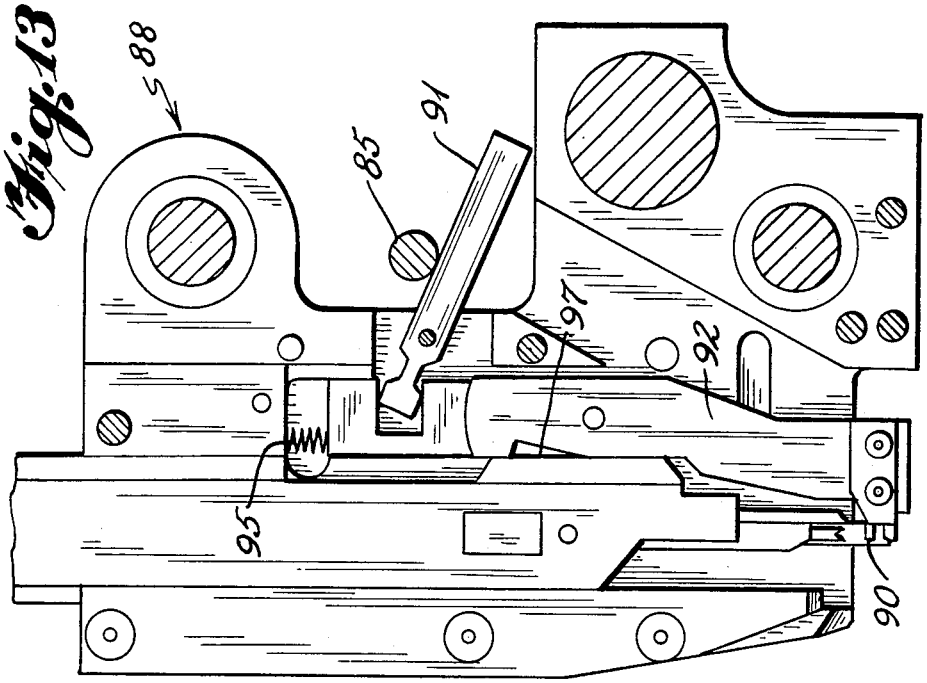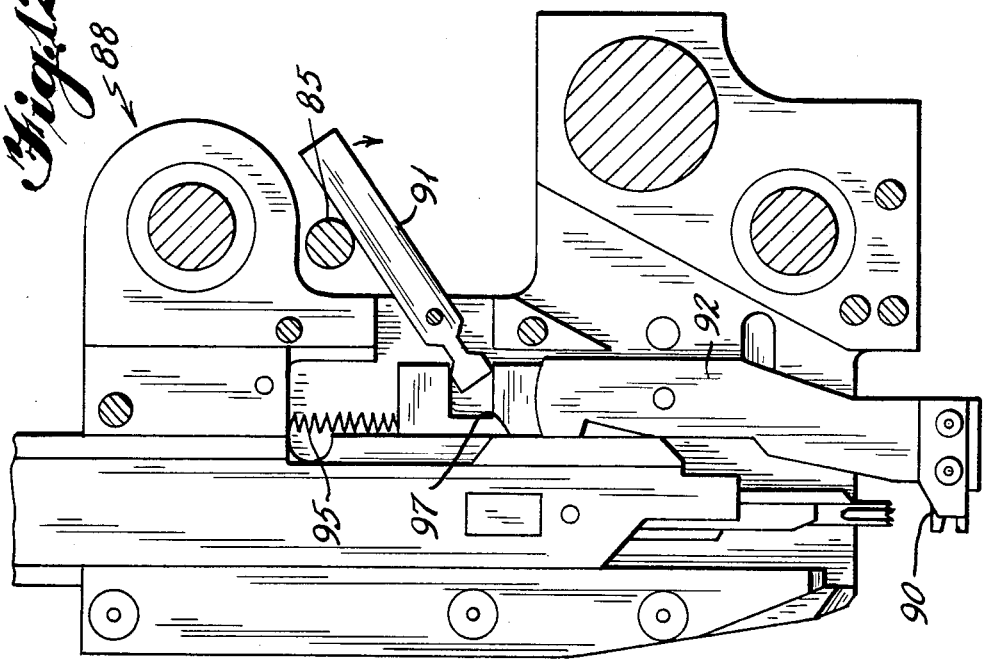

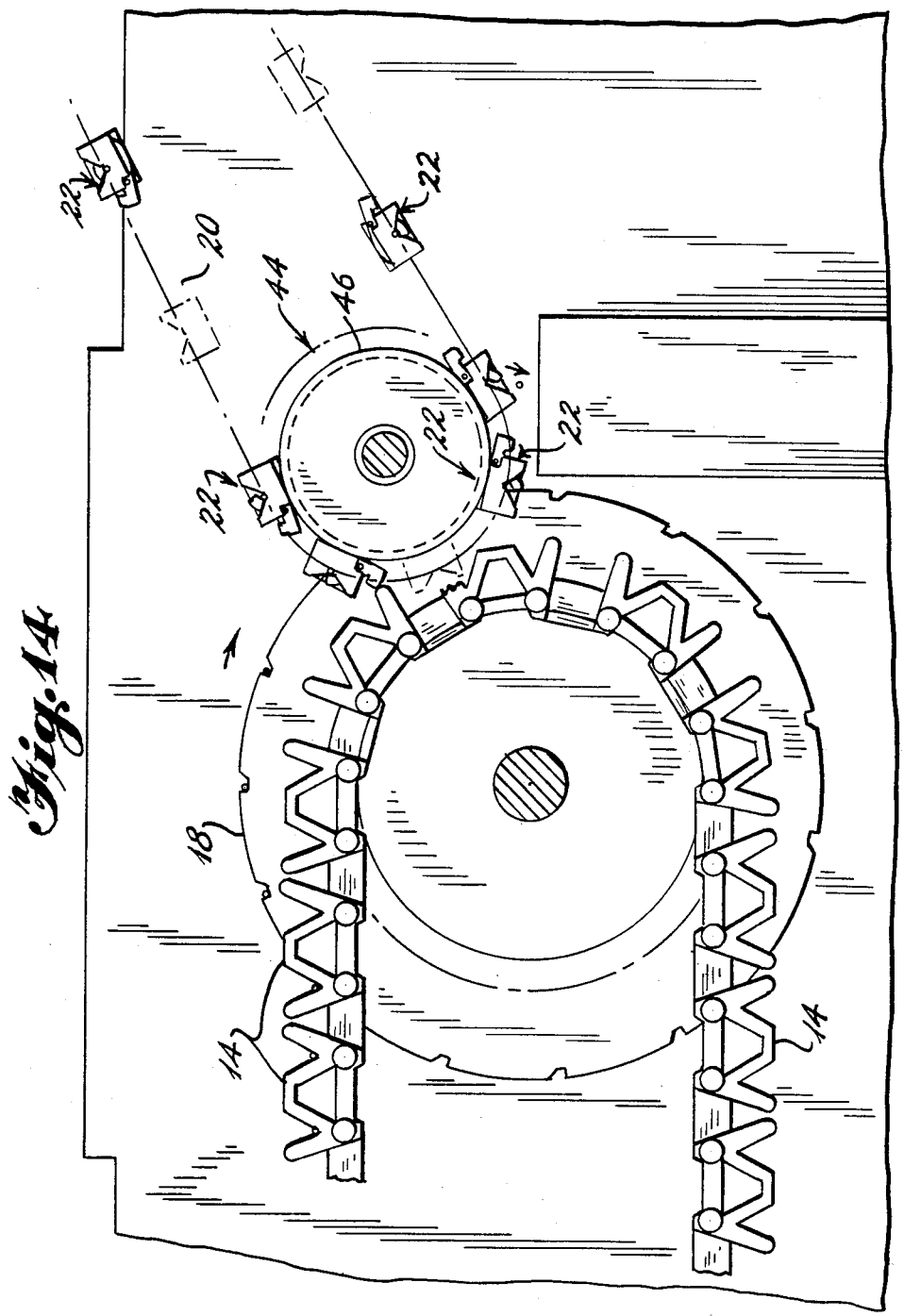

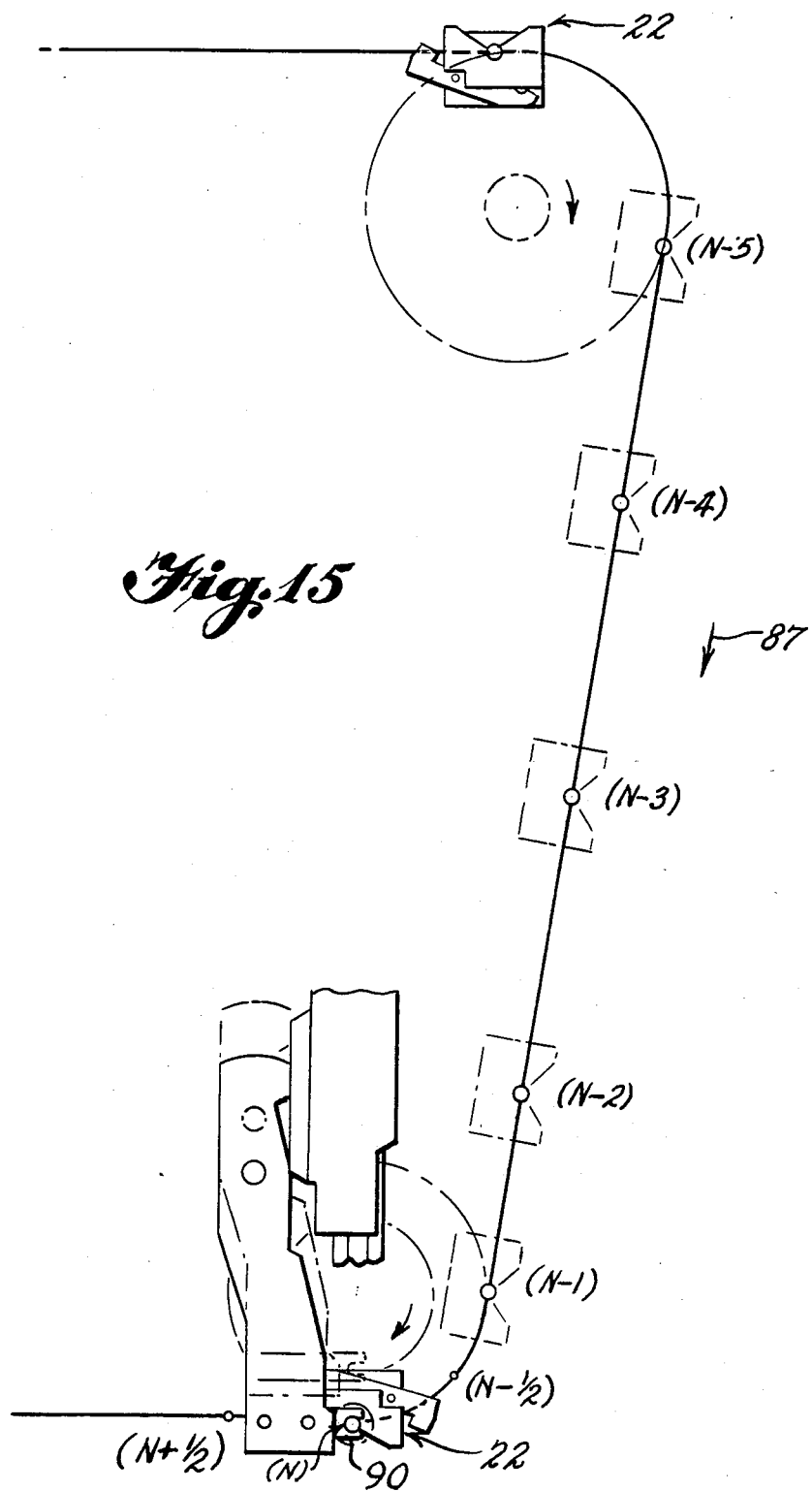

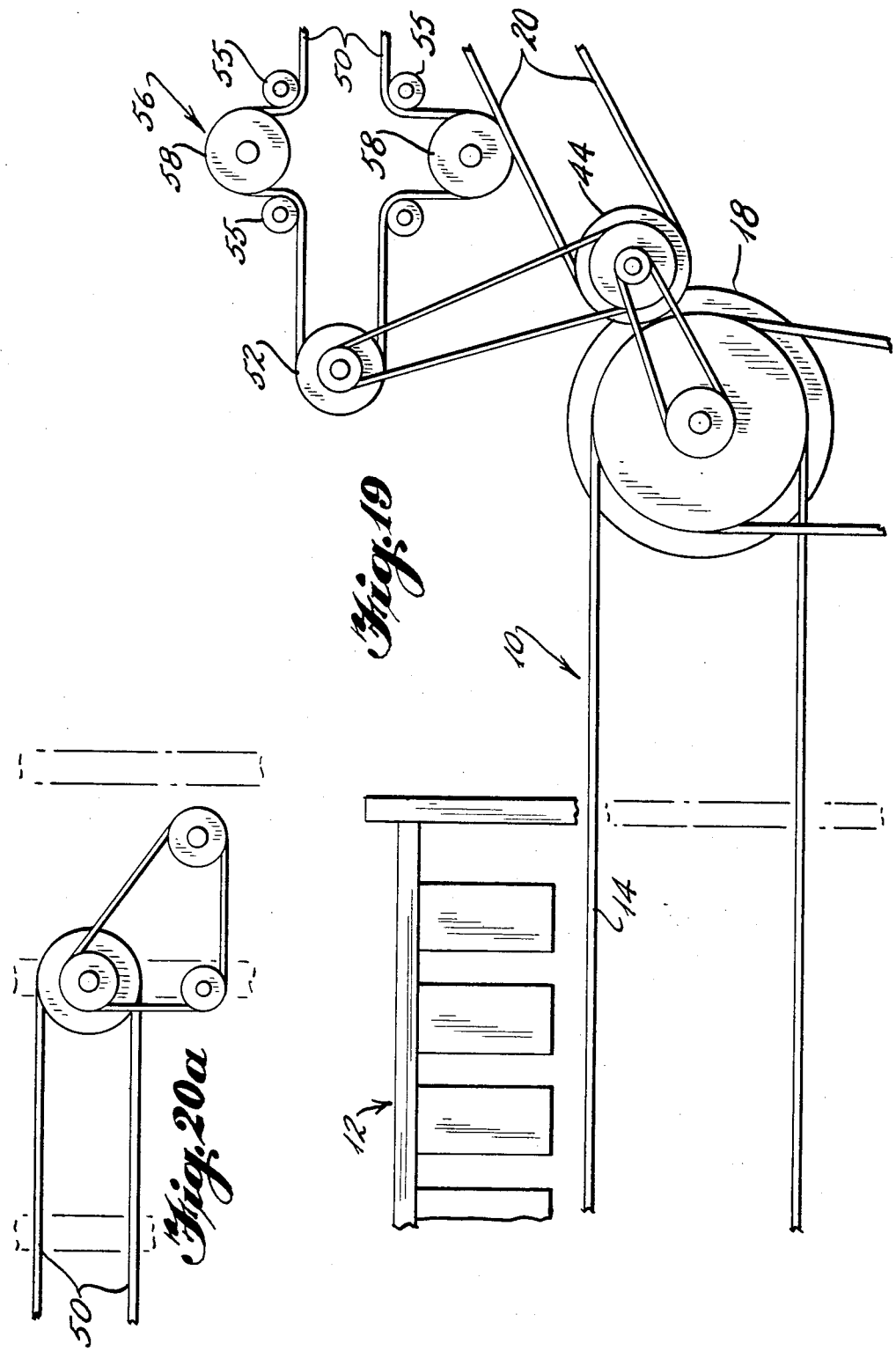

AXIAL-LEAD COMPONENT SEQUENCING AND INSERTING APPARATUS

CROSS REFERENCES TO PRIOR ART

U.S. Pat. No. 3,455,493—Ackerman, et al., COMPONENT SEQUENCING AND INSERTION APPARATUS, issued July 15, 1969.

U.S. Pat. No. 3,783,488—Ragard, et al., FILM MOUNTED ELECTRONIC COMPONENT INSERTION MACHINE, issued Jan. 8, 1984.

U.S. Pat. No. Re. 27,968—Ragard, et. al., MULTI-SIZE VARIABLE CENTER ELECTRONIC COMPONENT INSERTION MACHINE, reissued Apr. 9, 1974.

U.S. Pat. No. 4,417,683—Lewis, et al., CENTERING DEVICE FOR ELECTRICAL COMPONENTS, issued Nov. 29, 1983.

U.S. Application No. 394,122—Zemek, et. al., METHOD AND APPARATUS FOR CENTERING ELECTRICAL COMPONENTS, filed July 1, 1982.

BACKGROUND AND SUMMARY OF THE INVENTION

The present invention relates generally to an axial-lead component insertion machine incorporating an endless conveyor for feeding axial lead components in a predetermined sequence from plural supply dispensers to an insertion head which trims, forms, and inserts the component leads into holes of a circuit board.

Heretofore, film or tape mounted axial lead components have been fed to an insertion head which is adapted in sequence to: sever the leads of a presented component in order to separate such component from the film or a pair of spaced carrier tapes; bend the severed leads at right angles to the axis of the separated component; and finally drive the bent leads into preformed apertures provided in a circuit board disposed below the insertion head. U.S. Pat. No. 3,783,488 and U.S. Pat. No. Re. 27,968 are exemplary of such prior art and the disclosures of these patents are incorporated into this application by reference.

U.S. Pat. No. 3,455,493 discloses the feeding of axial lead components to an insertion head from a sequencer via an endless conveyor which supports the components for transport by cradling the leads, with components of different values being supplied to the head in a preselected sequence on said conveyor.

Two prior art centering devices are cross-referenced above and disclose lead forming, trimming, and inserting tooling of an insert head centered about a midplane such that tape fed components may be generally centered on the midplane, by opening and closing the tooling relative to the midplane, either while still attached to the feed tapes or after separation therefrom by lead trimming.

So far as we are aware, no prior art axial lead component insertion machine provides for: programmable sequencing of the components onto an endless conveyor having means for positively retaining the component leads, centering of each positively retained component, and/or selective retracting and extending of all of the insert head tooling from the feed path of the components after shifting only a portion of the component conveyor at said insert head relative to the remainder of the conveyor.

Among others, it is an object of the instant invention to provide a selectively retractable or otherwise moveable inside former such that the complete insert tooling is removeable from the feed path of components carried on an endless conveyor, in order that the insert station may be bypassed by selected components without handling thereof.

It is a further object of this invention to provide clips spaced along the conveyor for positively retaining components on the conveyor while allowing lateral shifting of the components and centering of the bodies thereof about a midplane of the insert tooling. Preferably, the clips are electrically insulative in order that on-line verifying of the electrical functioning thereof may be performed.

Still further, it is an object of the instant invention to provide means for changing the sequence of components fed to the insert head from the sequencer without the need for manual intervention.

Additionally, it is an object of the instant invention to provide shifting of only a portion of the conveyor relative to the remainder thereof so as to allow uninterrupted feed of components between the sequencer and insert head, while allowing components in the immediate vicinity of the insert head to be shifted reversely or forwardly relative to the feed of the conveyor in order to bypass the insert head or allow repair functions to be performed. Further, it is an object of the invention to provide for: on-line detecting of the presence and absence of components in their respective positions on the conveyor, verifying electrical functioning of each of the components, and centering of the bodies of the components about a midplane of the insert tooling.

Still further, it is an object of the instant invention to provide a method and apparatus by which on-line repair functions may be performed, and wherein the repair functions comprise replacement, centering, and testing of missing components, defective components, and misinserted components.

These and other objects and advantages of the present invention will be more clearly understood by reference to the following description and drawings.

The present invention involves a method and apparatus for feeding axial lead components directly from a sequencer to an insertion head while eliminating direct supplying of components to the insert head via a predetermined inventory such as reeled tapes or films having components attached thereto in a predetermined sequence. Preferably, an endless chain conveyor carries the components to the insert head from the sequencer in chain clips which positively retain the lead of the components while allowing centering of the bodies and electrical function testing of the components positively retained therein. The conveyor is capable of carrying several series of sequenced components, and the overall apparatus is changeable without manual intervention for bypassing the insert head with one or more components of a series without insert processing thereof, and changing the individually and programmably controlled dispenser heads of the sequencer. Such an arrangement provides for quick and flexible variation of the next sequenced series of components to be fed to the insert head. In order that such bypassing of the insert head may be accomplished without interruption of the overall feed between the sequencer and insert head, a particular portion of the conveyor in the area of the insert tooling is shiftable forwardly and reversely. Such shifting allows retraction of the inside formers of the insert tooling without interference with conveyor-carried components at the insert station. Additionally, the insert head of the instant invention is provided with a housing or door assembly covering a portion of the conveyor at the front or operator accessible portion of the insertion machine. This door assembly includes a verifier for the on-line testing of electrical functioning of each component and a centering mechanism for centering the bodies of the components about a mid plane while the leads thereof are retained in the clip carriers of the conveyor. Still further, when a component is missing or is defective and must be replaced, the centering arms of the door assembly are also operable to load a replacement component into a particular position of the conveyor, upon opening of the clip carriers of that position by an opener mechanism also mounted upon this door assembly. Other features of the invention will become apparent from the following disclosure.

BRIEF DESCRIPTION OF THE DRAWINGS

FIG. 7 is a left side elevation of the centering mechanism separate from FIG. 4.

FIG. 8 is an elevation of one centering arm, as generally viewed in the direction of arrows 8—8 of FIG. 7.

FIGS. 12 and 13 are elevations of one half of the split tooling assembly, as viewed from the midplane, in order to illustrate the action of the retractable inside former.

FIG. 14 is a side elevation illustrating details of the transfer of components from the sequencer to the inserter.

FIG. 15 is a left side schematic, generally indicating stations of operation relative to the feed path of the conveyor chain at the front of the insertion head.

FIGS. 19 and 19a are a schematic of the timing belts and conveyors of the complete system, illustrating their interactions together and with the sequencer and inserter.

FIGS. 20 and 20a are an elevational view illustrating the shift actuating assembly.

DETAILED DESCRIPTION OF THE INVENTION

Figure 1:
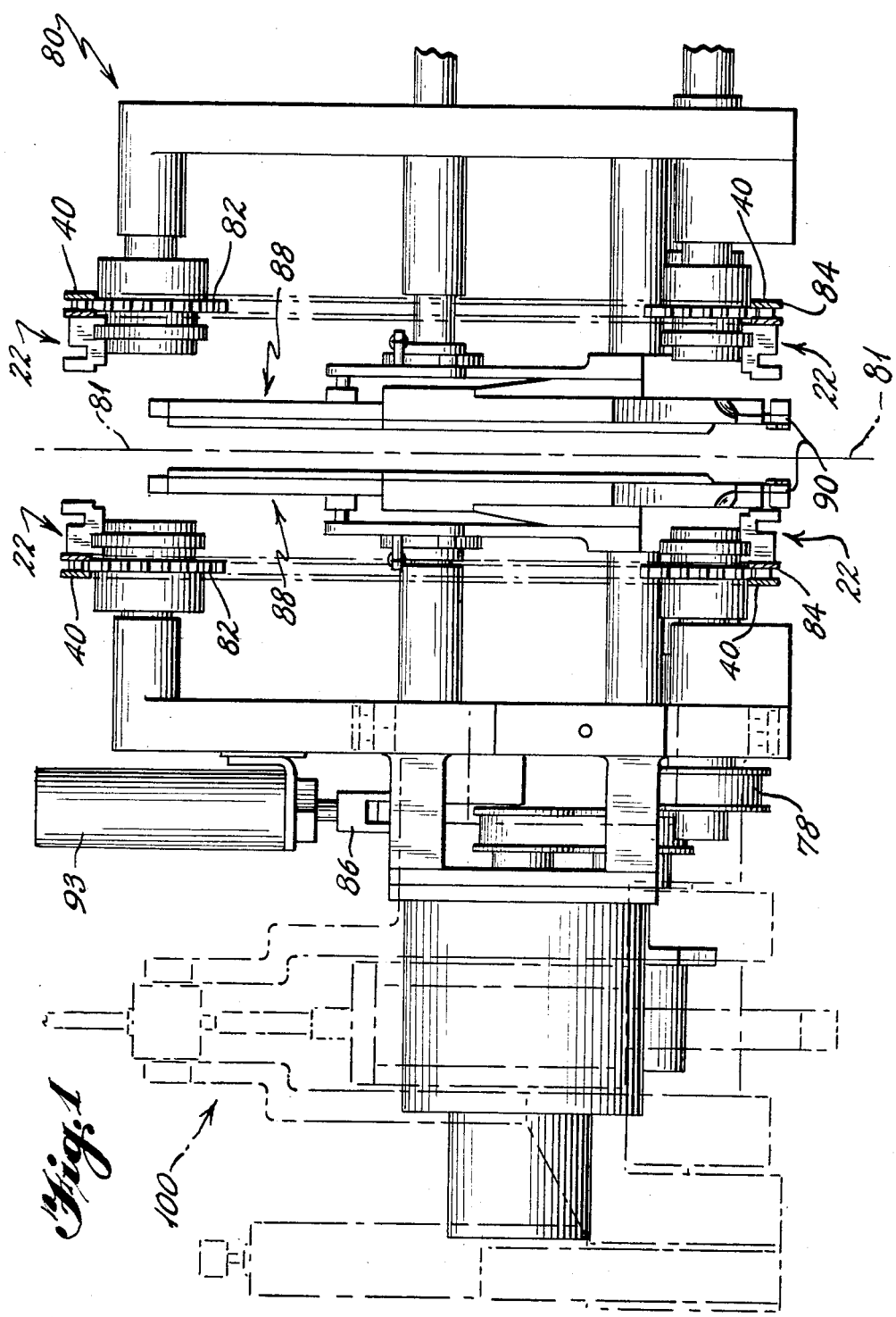
FIG. 1 is a front elevation of the insertion head, with a phantom line illustration of the door assembly in the open position.
Figure 19A:
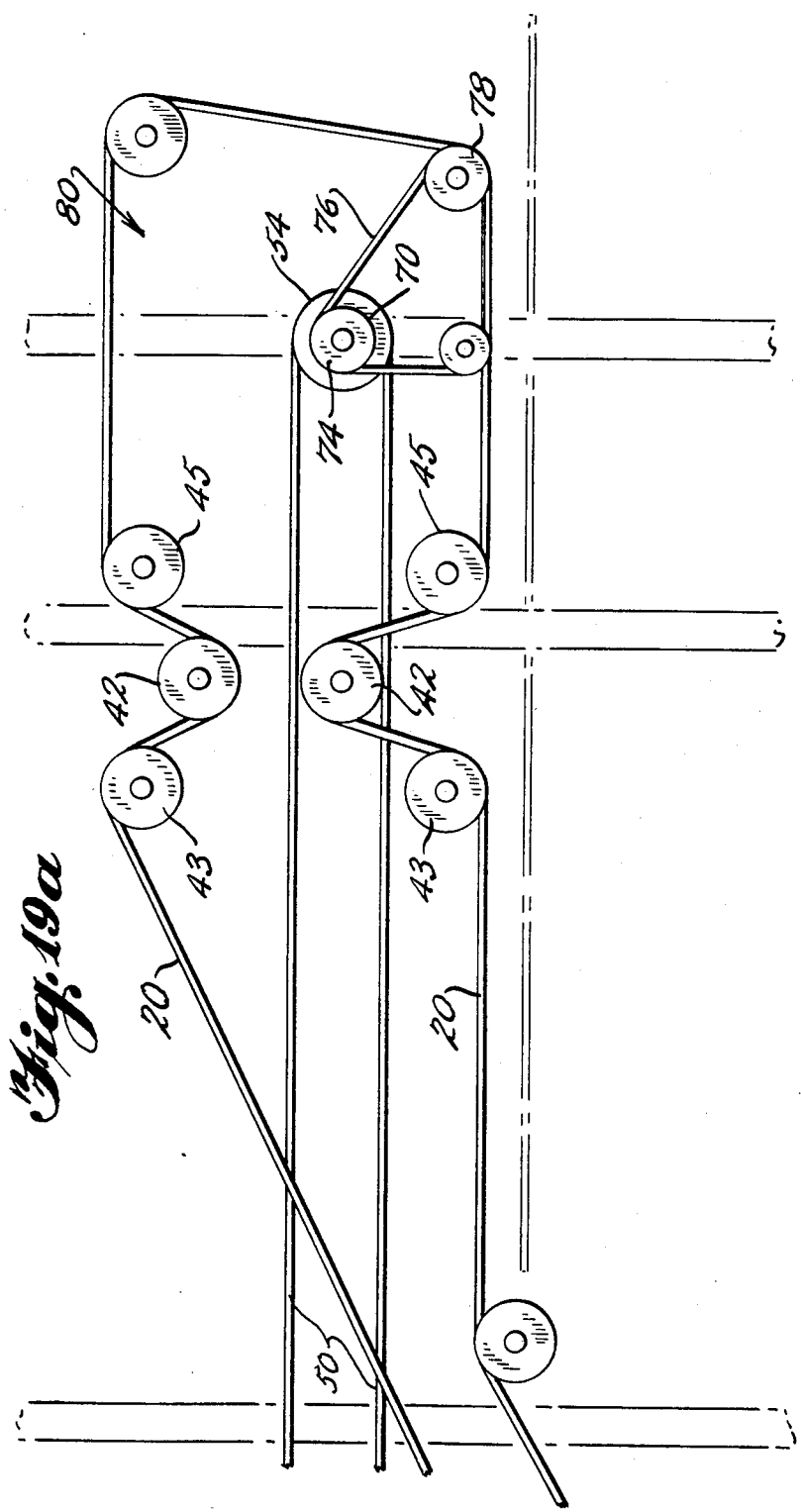

In the preferred embodiment of the invention, the split tooling insertion head assembly of FIG. 1 has a basic configuration similar to that of the above cross-referenced U.S. Pat. No. Re. 27,968 and is adapted to receive axial lead electrical components, via the supply and feed system illustrated in FIGS. 19, 20 and 14, for processing and mounting thereof onto a printed circuit board. As seen in FIG. 19, a sequencer 10 has a plurality of dispenser heads 12 to drop individual components onto an endless chain conveyor 14 and provide a series of presequenced components thereon. An example of a sequencer useful in this invention is given in the above cross-referenced U.S. Pat. No. 3,455,493. The series of presequenced components is transferred from conveyor chain 14 via transfer wheel 18 to another conveyor chain 20 which is located on the right hand side of FIG. 19, as indicated generally at 80. The provision of separate conveyor chains 14 and 20 and transfer wheel 18, along with other features of this invention, allows a supply of components to be fed at a generally constant rate to the insert head via conveyors 14 and 20, while also allowing that the front or right hand portion of conveyor 20 is shiftable forwardly and reversely relative to the constant rate of feed of the left hand portion of conveyor 20.

Figure 20:
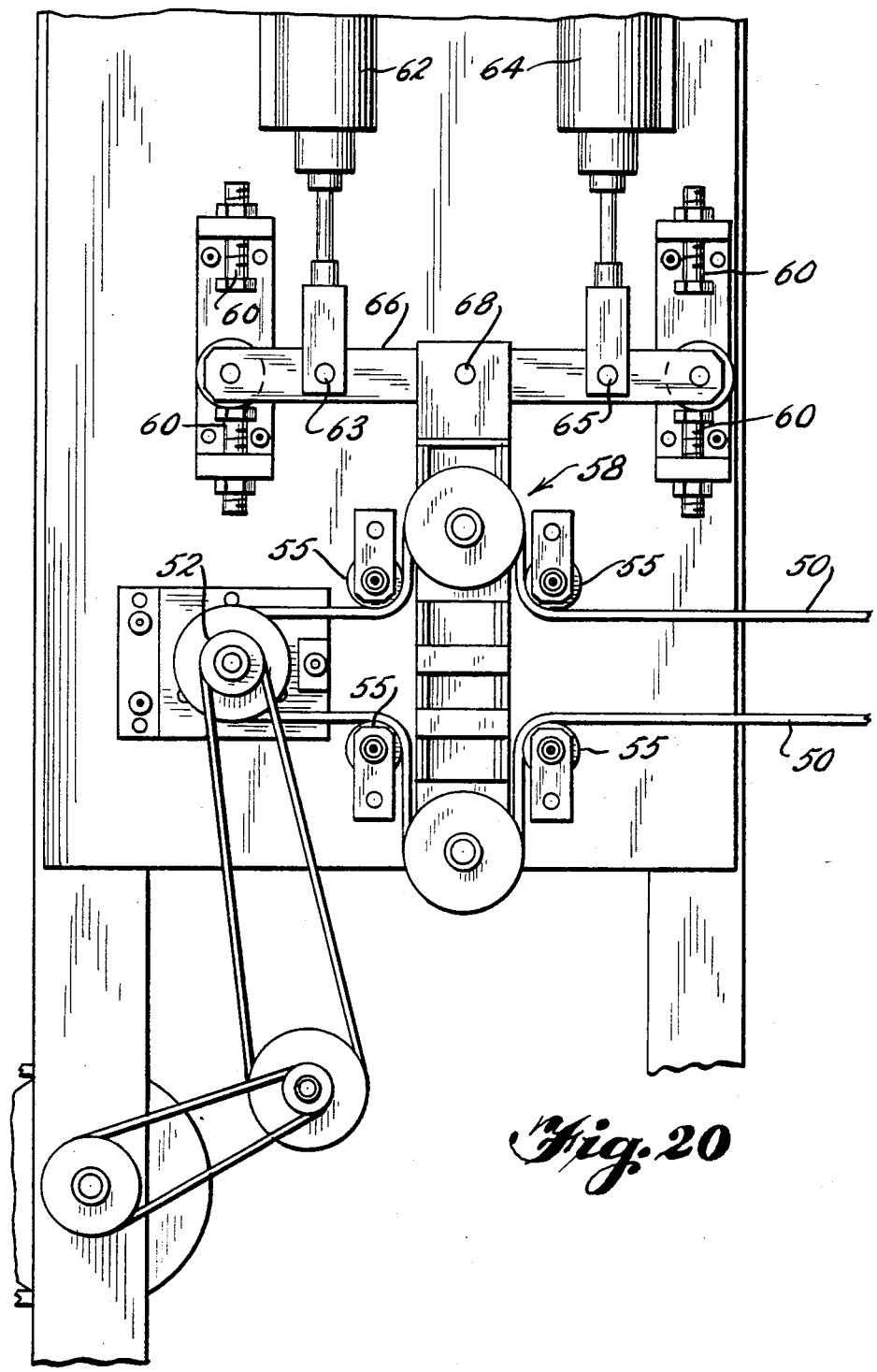

In order to accomplish such relative shifting between portions of conveyor chain 20, a timing belt 76 is drivingly coupled with the right hand portion of chain 20 via timing belt sprocket 78 mounted to the same shaft as chain sprocket 84 (best seen in FIG. 1). Timing belt 76, in turn, is drivingly coupled to timing belt 50 via timing belt sprockets 54 and 74 sharing a common rotation shaft. Referring to FIGS. 19 and 20, sprockets 52, 54, and 55 are fixed to a main frame, and sprockets 58 are shiftable relative to the main frame via a shift actuator assembly 56. As may be understood by reference to these drawings, sprocket 52 is drivingly coupled with chains 14 and 20 and transfer wheel 18 via other timing belts, any one of which may conceivably be directly or indirectly coupled to a main driving motor (not shown).

Shift actuator assembly 56 is best seen in FIG. 20 and comprises double sprockets 58 which are vertically displaceable as a unit by actuation of one or both of shift cylinders 62, 64. As seen in the drawings, the piston rod of each cylinder 62, 64 is pivotally attached to a lever 66 which, in turn, is pivotally attached to 68 to double sprocket assembly 58, and an adjustable stop 60 provide limits of travel of each end of lever 66. Upon actuation of shift cylinder 62 or 64, the corresponding end of lever 66 is raised from the normal operating position of FIG. 20 so that double sprocket assembly 58 is raised sufficiently that a half-step counterclockwise component of displacement is superimposed upon the normal clockwise rotation of timing belt 50. By actuating both shift cylinders 62 and 64, double sprocket assembly 58 is raised sufficiently to superimpose a full step of counterclockwise displacement upon clockwise rotating timing belt 50. Accordingly, either a half step or a full step backward component of movement is imparted to the normal forward movement of timing belt 50. Timing belt sprockets 54 and 70 are drivingly coupled to the same jack shaft 74, such that the triangular path of travel of timing belt 76 will have the same displacement component imparted thereto as does timing belt 50 upon actuation of shift assembly 56.

Referring to FIGS. 1 and 19, it may be seen that belt sprocket 78 of timing belt 76 is drivingly supported by the same rotatable shaft as is chain sprocket 84, about which conveyor 20 is passed. Spring biased chain tensioners 42 are positioned between two sets of fixed sprockets 43, 45 with the chain played thereabout, as illustrated in FIG. 19, such that the selected half step or full step reversed component of movement imparted to timing belt 76 is imparted to that portion of conveyor chain 20 which runs around the insert head 80. The arrangement of chain tensioners 42 and fixed sprockets 43, 45 allows movement of only that portion of conveyor chain 20 which is to the right of sprockets 43 as viewed in FIG. 19. In other words, an additional component of forward or reverse movement may be imparted to the "insert head portion" of chain 20 according to the forward or reverse displacement component imparted to the normal forward movement of timing belt 76. In referring to a forward component of displacement superimposable on normal movement of the timing belts and, hence, on the insert head portion of chain 20, it should be noted that such a forward component is realized, for instance, upon returning one or both shift cylinders 62, 64 to the normal extended position.

An advantage of superimposing a forward or reverse shift component upon the normal forward movement of conveyor chain 20 is realized when it is desired to retract or otherwise move inside former 90 (FIGS. 11-13 and 15) out of the feed path of chain 20, so as not to interfere with passage of any of the components carried on conveyor chan 20 past the insert station. Referring to FIG. 15, the forward direction of travel of chain 20 is indicated by arrow 87, and various processing stations N, N-1, N-2, etc. are spaced along the path of travel of chain 20 and correspond to positions of the conveying chain 20 which are a full step apart. As may be seen in FIG. 15, in order to retract inside former 90 out of the path of travel of chain 20, it is necessary to impart a half-step reverse movement such that a component normally located at the insert station N will be located at station N-½, thus allowing full retraction of inside former 90 without interference with the component thereon. Having retracted the inside former 90 to the phantom line position of FIG. 15, the conveyor chain 20 may then be stepped normally such that one or more components may bypass insert station N without interference. Of course, in order to resynchronize the conveyor chain for operation of the insert head and mounting of components on a circuit board, it is necessary to recover a half step of displacement by imparting a half step forward displacement to chain 20 only after the retracted inside former has been lowered to its normal operating position.

Figure 2:
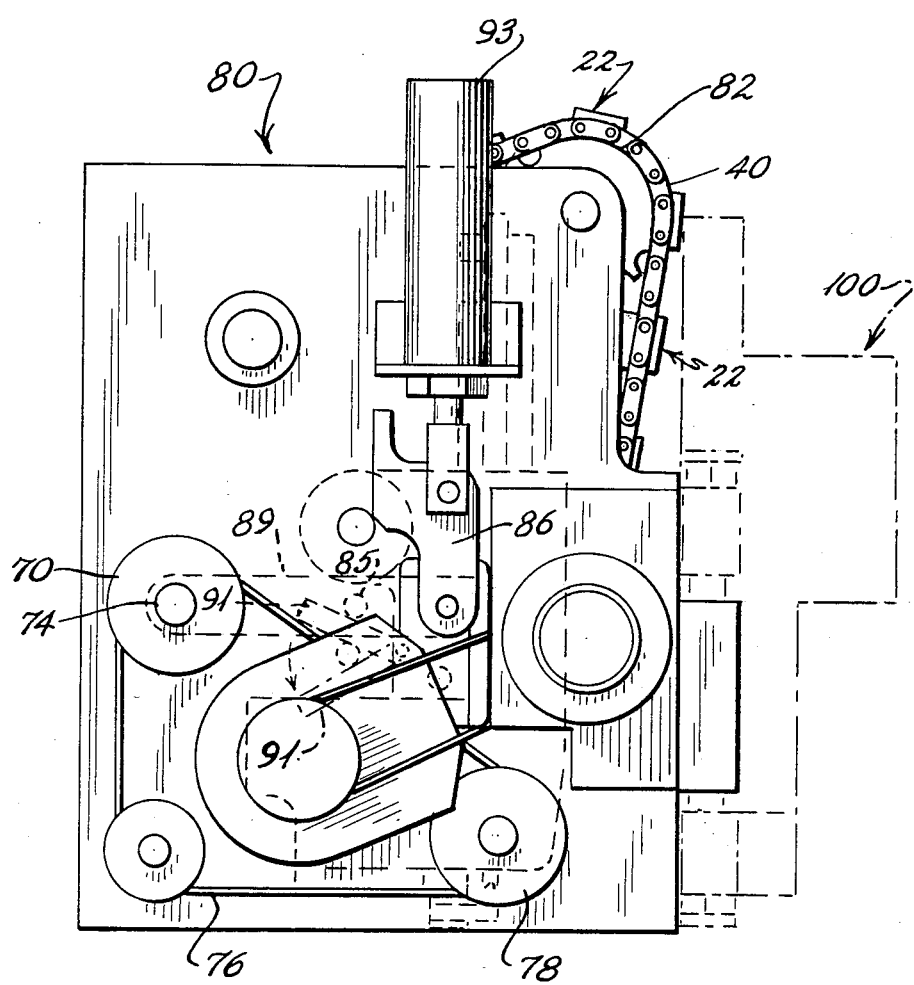
FIG. 2 is a left side elevation of the device of FIG. 1.
Figure 11:
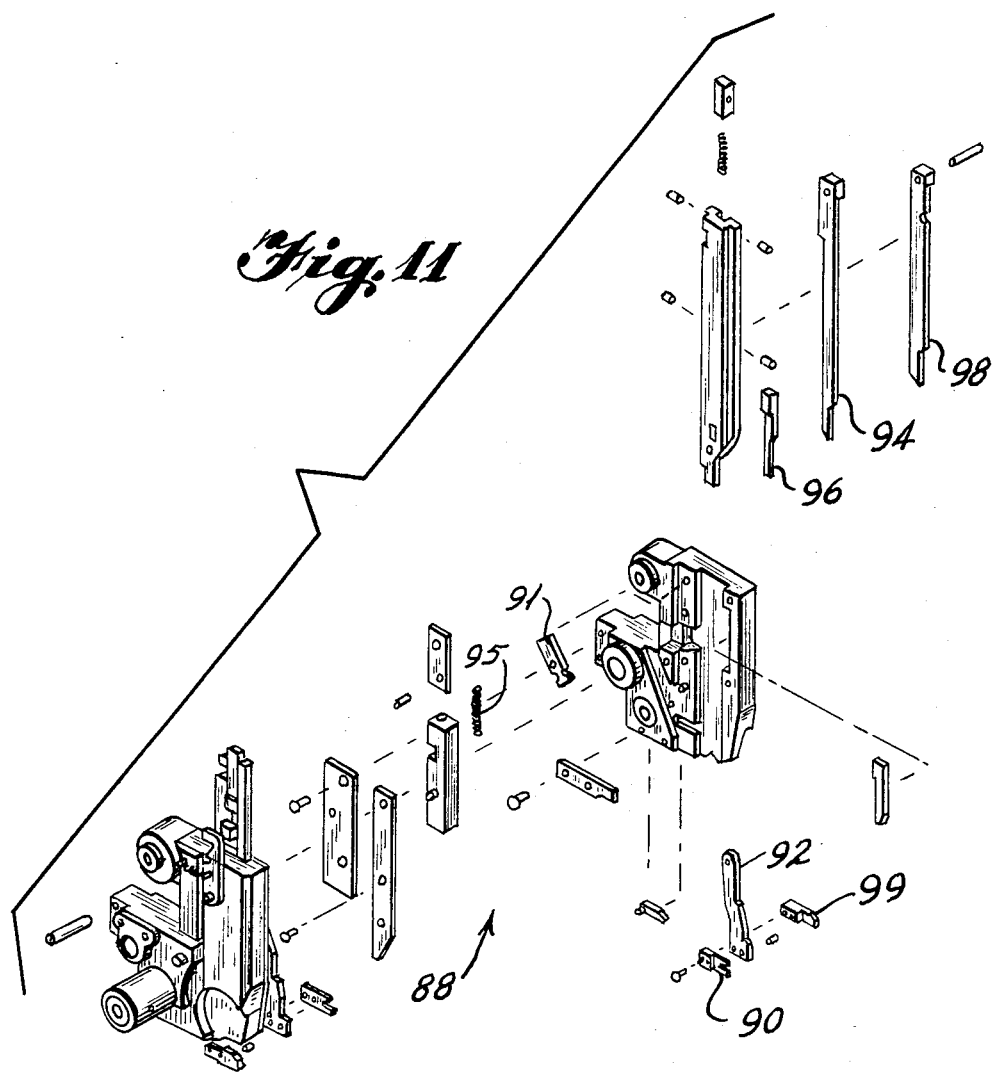
FIG. 11 is an exploded, isometric view of the insert head tooling assembly.

Referring to FIGS. 11-13, each half of the split tooling assembly 88 normally has: movable and fixed cutting blades 98 and 99 for trimming the ends of axial lead components; outside formers 94 for cooperating with inside formers 90; and forming the leads for insertion into holes of a printed circuit board; and kickout arms 92 supporting inside formers 90 such that the insider formers 90 are pivoted clear of the path of reciprocation of a driver 96 which drives the leads into circuit board holes. In addition to these normal parts of insert tooling 88, the instant invention comprises a slide way 97 within which kickout arm 92 may reciprocate after clearing inside former 90 from the path of travel of driver 96. Kickout arm 92 is caused to raise via a linked connection with pivotal lever 91, and to lower via the bias of spring 95. Referring to FIGS. 2 and 11, lever 91 is actuated by engagement with a rod 85 attached to link 89 which, in turn, is pivotally attached to link 86 for reciprocation thereof by cylinder 93.

Figure 16:
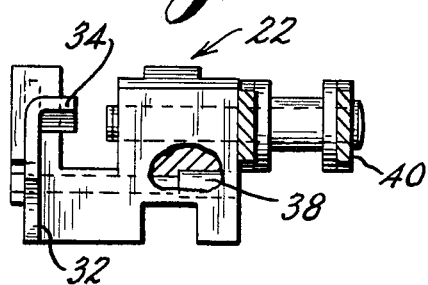
FIG. 16 is a front elevation, partially broken away, of a carrier clip.
Figure 17:
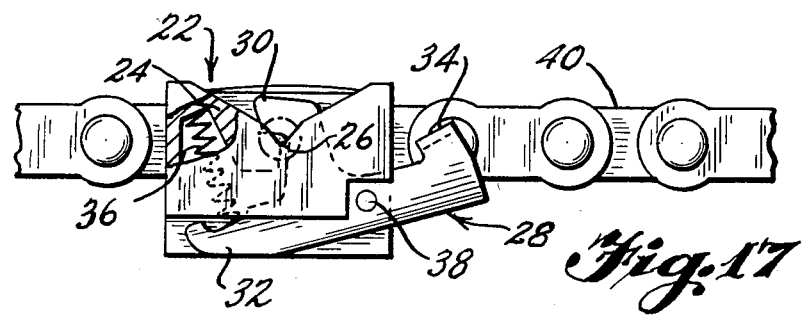
FIG. 17 is a left side elevation, partially broken away, of the clip of FIG. 16.
Figure 18:
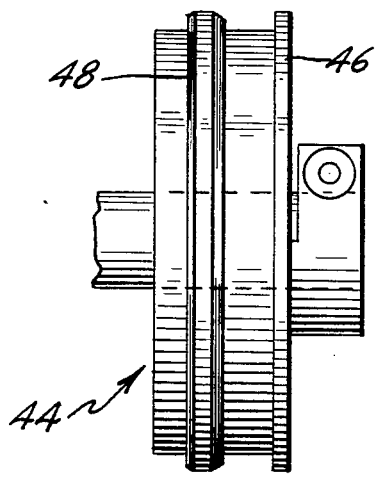
FIG. 18 is a front elevation of the roll for opening the chain clips.

As best seen by reference to FIGS. 14, 16, and 17, sequencer chain 14 is provided with V-notches into which the leads of components are cradled, and transfer wheel 18 has cooperating notches for lifting the components out of the notches of chain 14 and depositing them into clip carriers 22 of inserter chain 20. A clip carrier 22 is shown in detail in FIGS. 16 and 17 and comprises an electrically insulative body 24 with a V-notch 26 for receiving each component lead and a pivotal latch 28 having a lead engaging portion 30 for retaining the leads in V-notch 26. Compression spring 36 biases latch 28 about pivot point 38 to the position illustrated in FIG. 17. Portion 32 of latch member 28 is engageable by a clip opening roller 44 of FIG. 14 (shown in detail in FIG. 18) so as to rotate latch 28 in a clockwise direction against the bias of spring 36 for opening of V-notch 36. During the normal path of travel of chain 20, the chain clips 22 are successively opened by opener roll 44 at the position illustrated in FIG. 14 in order that any components or lead scraps passing insert head 80 are dumped by opening of chain clips 22 which then are ready for reception of components from transfer wheel 18.

In addition to the above-described improvements over the prior art, the instant invention is provided with meas to detect missing, defective, and misinserted components and to load replacement components into the respective chain clips 22 corresponding thereto and to center and verify electrical functioning of each of the replacement components. Provision is also made for testing and centering of each and every component prior to insertion thereof. Such functions are provided by the door assembly 100 of FIGS. 3-5 (also shown in phantom lines in FIGS. 1 and 2).

Figure 3:
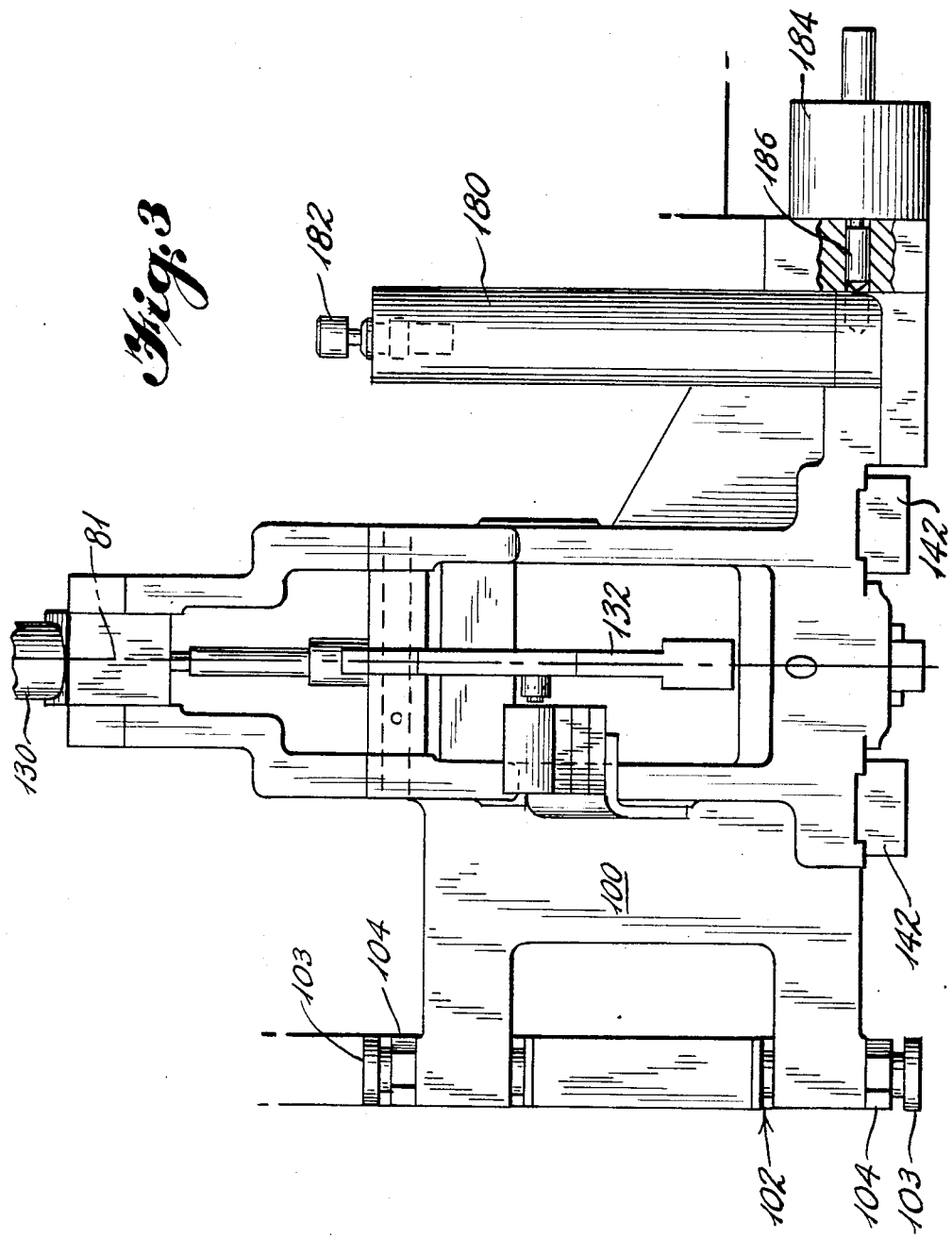
FIG. 3 is a front elevation of the door assembly in the closed position.

Door assembly 100 is attached to insert head 80 via hinge 102, with fine vertical adjustment of door assembly 100 relative to insert head 80 being provided by adjustable bushings 103 and cooperating nuts 104 (FIG. 3). Handle 180 is provided with an electrical interlock switch 182 which must be depressed by the operator in order to acutate cylinder 184 and release a locking pin 186 for opening of door 100.

A loading and centering housing 110 is mounted for pivoting about axis 115 through door assembly 100, with pivotal support and a lateral adjustment of housing 110 be provided by pins 112. Lateral adjustment and locking of pins 112 is accomplished through means of a set screw and locking nut arrangement 113. A pair of cooperating loading and centering arms 116 are pivotally supported by housing 110 via pivot pins 119, with springs 118 biasing lead receiving ends 117 toward midplane 81. The extent to which arms 116 may close upon midplane 81 is determined by engagement of the inner surfaces thereof with cam 120 which is shiftable in the direction of the longitudinal axis of shaft 122. Shaft 122 is caused to reciprocate along the longitudinal axis thereof via connection to arm 132 which is pivotally connected at 134 and actuated by extension and retraction of cylinder 130, as will be appreciated by reference to FIG. 4. As may be seen from this Figure, cam shaft 122 is connected to an adjustment mechanism 129 through a universal joint 124, with tension springs 128 removing "play" due to machine tolerances.

Figure 4:
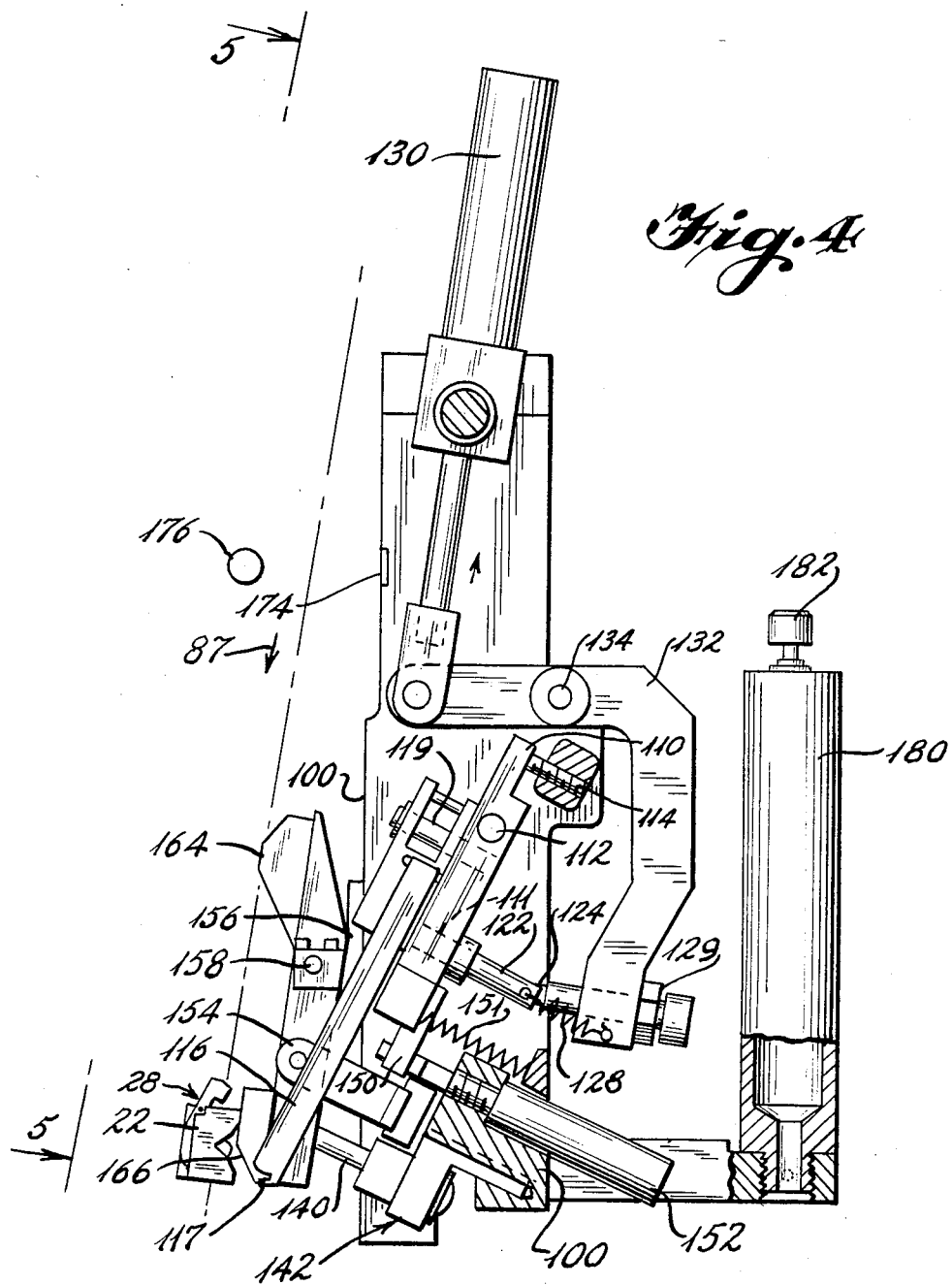
FIG. 4 is a left side elevation, partially in cross-section, of the door assembly of FIG. 3.
Figure 5:
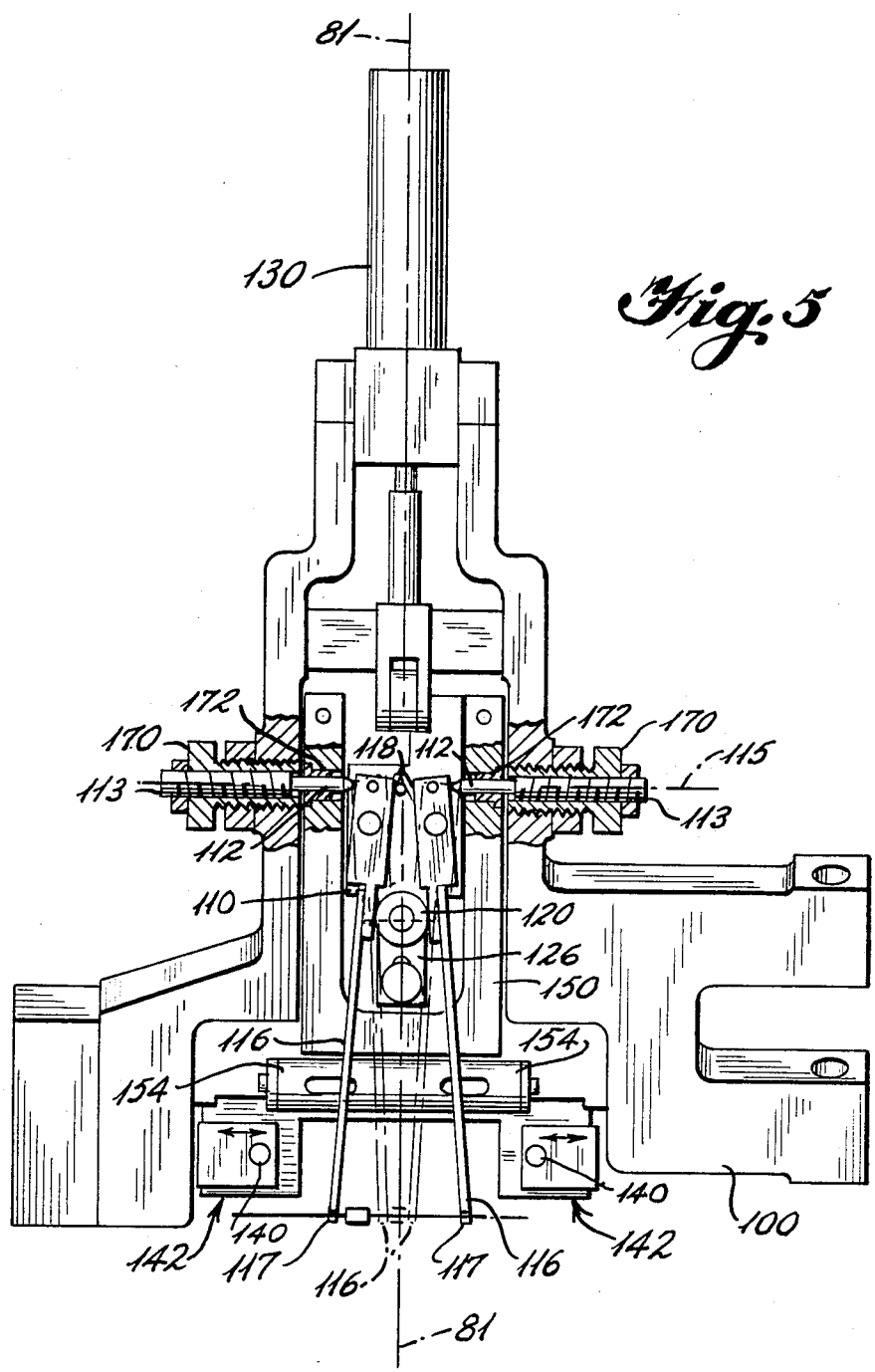
FIG. 5 is an elevation, as generally viewed in the direction of arrows 5—5 of FIG. 4, with the verifier assembly removed for clarity of illustrations of the loading and centering arms.
Figure 6:
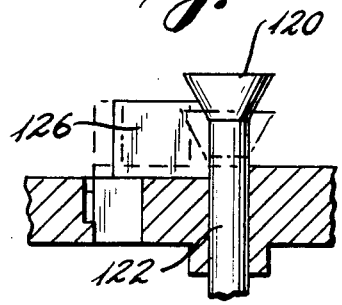
FIG. 6 is a partial, detailed view of the cam for opening the centering and loading arms.

The extent to which shaft 122 and cam 120 are retractable (generally to the right as viewed in FIG. 4) is adjustably determined by a cam stop 126, best seen in FIGS. 5 and 6. The positioning of cam stop 126 determines the extent to which arms 116 will be spread apart, by engagement with cam 120, so that the device is adjustable for receiving component bodies of various lengths between arms 116. As may be appreciated by reference to FIG. 4, actuation of cylinder 130 will move rod 122 leftward and, via spring 127, will cause pivoting of housing 110 until the upper portion thereof engages with an adjustable stop 114. As seen in FIGS. 4 and 7, one end of spring 127 bears against housing 110 and the other end against a pin of universal joint 124. Thereafter and during further pivoting of arm 132 by cylinder 130, shaft 122 will be displaced to the left along its longitudinal axis and relative to housing 110 such that arms 116 will be allowed to close toward midplane 81 under control of cam 120 and under the influence of springs 118. This closing of arms 116 upon opposite ends of the body of a component provides centering the component body upon midplane 81.

As also may be appreciated by reference to FIG. 4, the initial pivoting of housing 110 with arms 116 spread apart, facilitates loading of an electrical component into carrier clip 22 of chain conveyor 20. In order to open clip latch 28, a clip opening piston and cylinder arrangement 140 is provided which, upon firing of the cylinder, will extend the piston to engage portions 34 of chain clip latches 28 and open the chain clips 22 for reception of the leads of a component from slots 117 of each arm 116.

Figure 9:
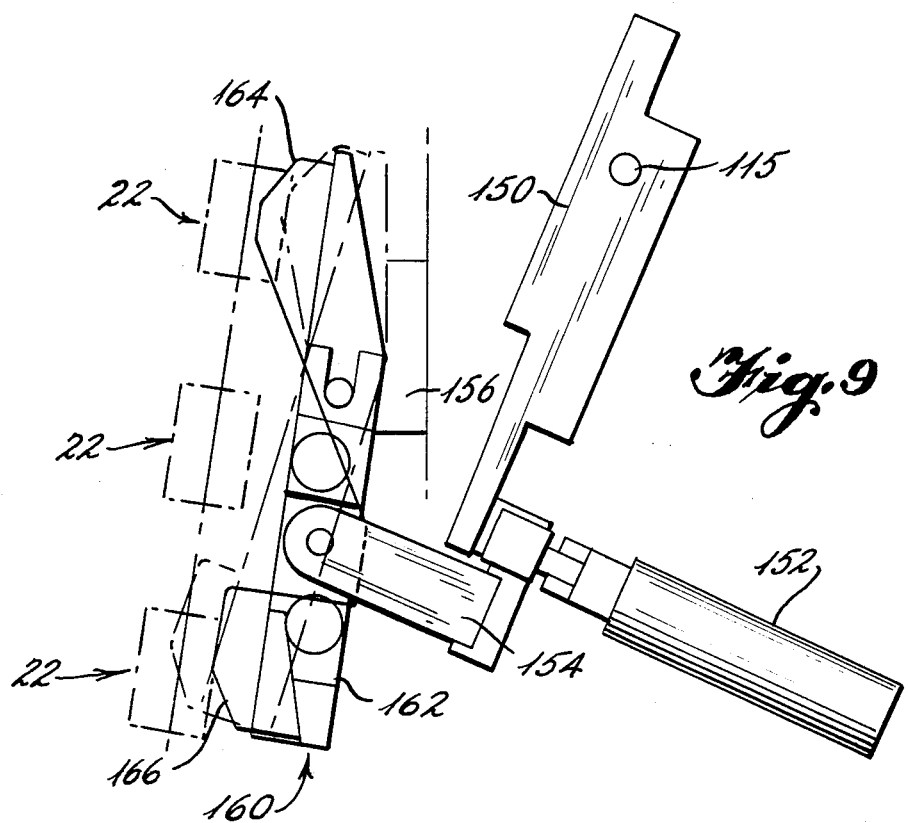
FIG. 9 is a left side elevation of the verifier assembly separated from FIG. 4.
Figure 10:
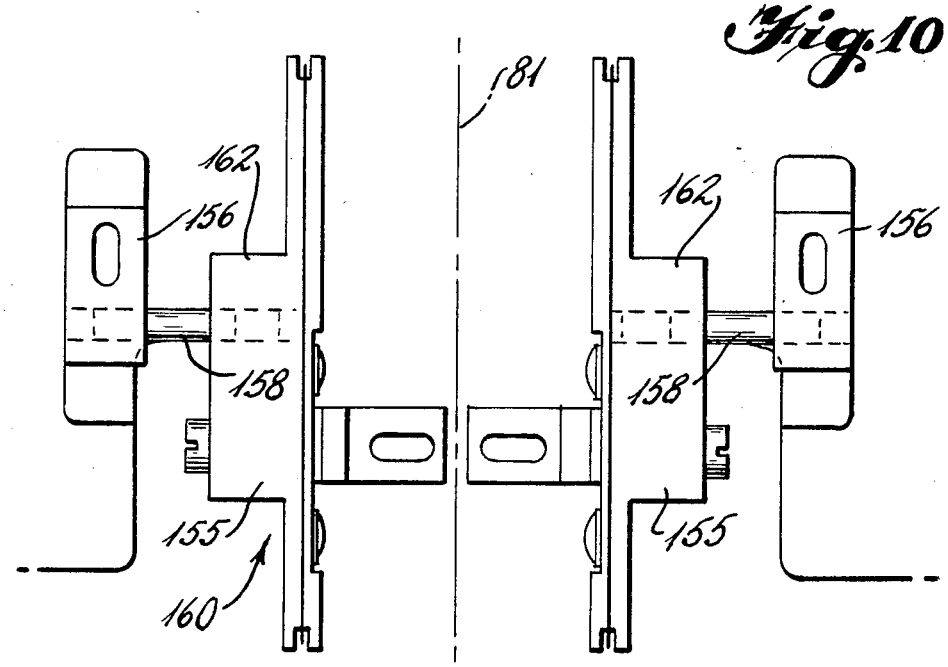
FIG. 10 is an elevation of the verifier assembly, as viewed by the components being tested.

Referring to FIGS. 4, 5 and 9, a verifier support yoke 150 is also pivotal about axis 115 via support bushings 172 on pins 112, with lateral adjustment of yoke 150 provided by adjustment screw 170 (FIG. 5). A verifier assembly normally attached to yoke 150 has been removed from FIG. 5 in order to properly illustrate the earlier described loading and centering arms 116.

Yoke 150 is held in the position of FIG. 4 by retracted cylinder 152. Upon release of cylinder 152, compression springs 151 causes yoke 150 to pivot about axis 115. As seen in FIGS. 4, 5 and 9, generally L-shaped arms 154 are attached to yoke 150 and are adjustable laterally thereof according to the body lengths of the components being tested. Each verifier contact assembly 160 comprising an electrically insulative block 162 supporting primary verifier contact 164 and secondary verifier contact 166, which contacts are electrically attachable by any well-known means to a component tester such as the one described in U.S. Pat. No. 4,050,017. Support of the verifier assembly on door assembly 100 is provided by L-shaped bracket 156 and pivot pin 158. Primary contact 164 is normally positioned to contact the component leads during feeding thereof, while secondary contacts 166 are for selective subsequent tests when needed.

As seen in FIG. 4, a component detection system comprises a reflector 174 mounted on door assembly 100 and a bifurcated fiber optic bundle transmitter and receiver 176 opposite reflector 174 with conveyor chain 20 therebetween, such that absence of a component from a carrier clip 22 would not provide the normal interruption of the transmitter/receiver expected for each chain clip.

GENERAL OVERALL OPERATION OF THE INVENTION

In operation, conveyor chains 14 and 20 are incremented stepwise while V-notches of conveyor 14 are loaded by dispenser heads 12 of sequencer 10 according to a controller such as a programmed computer, after which the series of sequenced components are transferred by notches of rotary transfer wheel 18 to clips 22 of insert conveyor 20. The presequenced series of components are thus fed to the insert head 80, while the various incremental steps of movement of the conveyors are counted by the controller in order to ascertain where a first and last component of each sequence is located along the path of travel.

Between the processing stations N-5 and N-4 (FIG. 15), a PART DETECT routine is performed in concert with incremental stepping of the conveyor 20 so as to detect whether or not a particular chain clip 22 of conveyor 20 contains a component. If absence of a component is detected, then the program is flagged for subsequent corrective action at processing station N-1. Having incremented the conveyor clip 22 to processing station N-3, a VERIFY I routine is performed by primary contacts 164 of the verifier assembly being in contact with each lead of a component and testing electrical functioning of the component. If the component tested is bad, then chain clip 22 holding it is flagged for subsequent retesting at processing station N-1. In the present prototype, no processing is performed at station N-2. At station N-1, various options are available as follows:

(1) If the component tested as "good" at the N-3 processing station, its body is centered by centering arms 116 while the leads are still retained in chain clips 22 by latches 28.

(2) If a component tested as "bad" at processing station N-3, then the verifier assembly 160 of station N-1 is pivoted to remove primary contacts 164 from another component at station N-3 and to contact secondary verifier contacts 166 with the leads of the component at station N-1. If the component is found to be "good" during the second test (VERIFY II), then it is centered by fingers 116 while being retained in clip 22. If the component tests as "bad" again, then the operator is notified for replacement thereof. In order to replace a defective component, an operator pushes switch 182 of handle 180, in order to release latch 186 and pivot door assembly 100 about hinge 102, for access to conveyor chain 20 and arms 116, respectively. Thereupon, the operator removes a defective component from the carrier cip 22 positioned at station N-1, places the leads of a replacement component into slots 117 of arms 116, and closes door assembly 100. In accordance with a controller, latch opening cylinders 140 are fired to open latches 28 of the clip 22 and allow reception of the replacement component into conveyor clip 22 from loading arms 116. Upon relaxing of cylinders 140, latches 28 retain the leads of the replacement component and arms 116 center the body of the component relative to midplane 81 through actuation of cylinder 130. At this time, the component is again tested by secondary contacts 166 of the verifier. If necessary, such a sequence is repeated until a replacement component tests "good" and the conveyor chain may be incremented to the next station.

(3) If a component is missing at station N-1, as indicated by the flagging of the corresponding clip carrier 22 during the PART DETECT routine, then the above described loading, centering and retesting of a component is performed until a component tests "good" before stepping to the next station.

(4) If, during the normal clinching operation that is performed at the insert station, a misinsertion is detected, i.e., both leads of the component are not properly inserted into the holes and clinched to the bottom of the circuit board; then conveyor chain 20 is incremented one half-step rearwardly (to N-½) as earlier described, the inside former 90 is retracted, chain 20 is incremented another half-step backward, the operator is notified to open door assembly 100 and remove the misinserted component from the printed circuit board or chain clip, and the above-described replacement of a component is performed.

Between processing stations N-1 and N, various adjustments to the insertion tooling are performed for each component. For instance, the printed circuit board is repositioned under the insert head for reception of a new component, the insert tooling horizontal span is adjusted according to the span between the holes of the circuit board into which the component leads are to be inserted, the clinch assembly is adjusted in span to correspond to that of the insert tooling span, and the depth is adjusted to which the driver of the insert head will insert the leads into the holes (for instance, according to the component body diameters). At processing station N, as indicated above, the leads of the component are trimmed, formed, and inserted into the holes of the circuit board for clinching to the underside thereof, and proper insertion and clinching of the leads is detected at this time. As also described above, a replacement routine is performed upon a misinsertion of a lead.

Any time during the processing of a series of presequenced components, it is possible to halt further insertion thereof and bypass any one or more components of a series past the insert head so that they are not mounted on the circuit board. Because of a counting of the steps of travel of each component from the sequencer through the inserter, resequencing (a new series) may be started at any time and, according to the program of the controller, the conveyor clip for the first component of a sequence is checked upon arriving between stations N-5 and N-4.

It will thus be seen that the objects as set forth above, among those made apparent from the preceding description, are efficiently attained and, since certain changes may be made in carrying out the above method and in the construction set forth without departing from the scope of the invention, it is intended that all matter contained in the above description or shown in the accompanying drawings shall be interpreted as illustrative and not in a limiting sense. For instance, various modifications will be become apparent to the skilled artisan, such as the possibility of using chains instead of the timing belts 50 and 76. However, chains are subject to wear and are very inaccurate; thus, timing belts have been selected for such control functions.

We claim:

1. In an apparatus for automated processing of axial lead components, each having a body and at least two leads extending generally coaxially in opposite directions from said body, said processing comprising inserting leads of said components into corresponding holes of a circuit board at an insert station, said apparatus having means for conveying a series of said components incrementally along a conveying path to said insert station, means for forming said leads preparatory to said inserting, and means for performing said lead inserting, the improvement comprising:
   means for shifting at least a portion of said conveying means in a reverse direction sufficiently for said forming means not to engage components carried on said conveying means during moving of said forming means from said path at a forming station, and for shifting at least said conveying means portion in a forward direction sufficiently for at least one of a series of spaced component positions of said conveying means to bypass said forming station prior to moving said forming means back into said path while not engaging said components; and
   means for moving said forming means from and into said path according to a controller.

2. The improvement of claim 1, wherein said lead forming means comprises:
   inside and outside formers, said inside formers comprising lead receivers located relative to said conveying means so as to receive the leads of component fed to said insert station and said outside formers being moveable relative to said inside formers for forming said leads; and
   said means for moving said forming means comprises means for retracting said inside formers from said path and avoiding contact with said components during a bypass routine.

3. The improvement of claim 1, wherein said conveying means comprises:
   spaced cooperating endless conveyors each having a series of clips spaced along a length thereof such that each clip of a conveyor mirrors a clip of a cooperating conveyor, said clips each comprising means for positively retaining a component lead such that said components are retained when said clips are inverted.

4. The improvement of claim 3, and further comprising means for purging said conveying means of components and lead scraps which bypass said insert station, said purging means comprising clip opening wheels located in said conveying path after said insert station and engageable with said clip retaining means to release leads therefrom.

5. The improvement of claim 1, and further comprising:
   split tooling generally centered about a midplane to define left side tooling and right side tooling located on opposite sides of said midplane, said tooling comprising said forming and inserting means; and
   means for moving said left and right tooling in concert toward and away from said midplane in order to adjust a tool span therebetween corresponding to a hole span between circuit board holes according to a next set of leads to be inserted.

6. The improvement of claim 5, wherein said tooling further comprises:
   means for trimming an end of each of said leads in order to remove said component from said conveying means while retaining said lead ends as lead scraps.

7. The improvement of claim 1, wherein:
   said apparatus further comprises means for loading components onto another portion of said conveying means and into said series of spaced positions of said conveying means in a preselected sequence according to said controller;
   said shifting means further comprises means for shifting said conveying means portion relative to said other conveying means portion such that components corresponding to said spaced positions of said portion are subjectable to a repair function during incremental advancing of said other conveying means portion;

means for detecting missinserted leads of a component at said insert station; and means for replacing a component into a conveying means position corresponding to said missinserted leads component.

8. The improvement of claim 1, and further comprising:

means for centering said components about said midplane while said components are held be lead retaining clips of said conveying means.

9. The improvement of claim 1, and further comprising:

means for testing electrical functioning of said components during said conveying and for flagging a particular position of said conveying means when a bad component corresponding to said particular position fails said testing, in order that replacement of said bad component may be effected.

10. The improvement of claim 1, and further comprising:

means for opening and closing lead retaining clips of said conveying means portion in order to receive and retain the leads of a replacement component therein.

11. The improvement of claim 10, and further comprising:

means for loading said replacement component into a particular position of said conveying means portion and for centering said replacement component about said midplane, said replacement component being substantially equivalent to a component preselected for said particular position.

12. The improvement of claim 9, and further comprising:

means for loading said replacement component into said particular position and for centering said replacement component about said midplane, said replacement component being substantially equivalent to a component preselected for said particular position.

13. The improvement of claim 7, and further comprising:

means for centering said components about said midplane while said components are held on said conveying means by lead retaining clips.

14. The improvement of claim 7, and further comprising:

means for testing electrical functioning of said components during said conveying and for flagging a particular position of said conveying means where a bad component corresponding to said particular position fails said testing, in order that replacement of said bad component may be effected.

15. The improvement of claim 14, and further comprising:

means for loading said replacement component into said particular position and for centering said replacement component about said midplane, said replacement component being substantially equivalent to a component preselected for said particular position.

16. The improvement of claim 7, and further comprising:

means for opening and closing lead retaining clips of a particular position of said conveying means portion in order to receive and retain the leads of a replacing component; and means for testing electrical functioning of said replacing component.

17. The improvement of claim 11, wherein said loading and centering means comprises:

a loading assembly adjacent and moveable toward and away from said path to provide an operator access to said loading assembly and to said conveying means, and comprising lead receiving arms pivotally openable and closeable in order to accept component bodies therebetween and to center said bodies about a plane through said loading assembly, said arms also being pivotal about an axis generally perpendicular to said loading assembly plane in order to load a replacement component into said particular position by placing the leads of said replacement component into said lead retaining clips during said opening thereof such that said plane substantially coincides with a midplane of said forming and inserting means.

18. The improvement of claim 17, wherein said loading assembly is moved toward and adjacent to said path for operation of said apparatus when not replacing a component, said loading assembly further comprising means for centering each component body about said midplane while being held by said retainer clips of said conveying means.

19. The improvement of claim 18, and further comprising:

means for verifying electrical functioning of each of said components while being held by a retainer clip.

20. In an apparatus for automated processing of axial lead components, each having a body and at least two leads extending generally coaxially in opposite directions from said body, said processing comprising inserting leads of said components into corresponding holes of a circuit board at an insert station, said apparatus having means for conveying a series of said components incrementally along a conveying path to said insert station, means for forming said leads preparatory to said inserting and means for performing said lead inserting, the improvement comprising:

means for centering each component, while carried by lead retaining clips of said conveying means, relative to a midplane about which said forming and inserting means are centered, said centering means comprising a pair of opening and closing arms each engaging said body so as to center said body upon said midplane during closing of said arms, said leads being retained in said clips and slideable in a direction generally perpendicular to said midplane during said centering.

21. The improvement of claim 20, and further comprising:

split tooling generally centered about a midplane to define left side tooling and right side tooling located on opposite sides of said midplane, said tooling comprising said forming and inserting means;

means for moving said left and right tooling in concert toward and away from said midplane in order to adjust a tool span therebetween corresponding to a hole span between circuit board holes according to a next set of leads to be inserted; and means for trimming an end of each of said leads in order remove said component from said conveying means while retaining said lead ends as lead scraps.

22. The improvement of claim 20, wherein:
said apparatus further comprises means for loading components onto another portion of said conveying means and into said series of spaced positions of said conveying means in a preselected sequence according to said controller;
means for detecting missinserted leads of a component at said insert station; and
means for replacing a component into said conveying means position corresponding to said missinserted leads component.

23. The improvement of claim 20, and further comprising:
means for testing electrical functioning of said components during said conveying and for flagging a particular position of said conveying means when a bad component coresponding to said particular position fails said testing, in order that replacement of said bad component may be effected.

24. The improvement of claim 20, and further comprising:
means for opening and closing lead retaining clips of said conveying means portion in order to receive and retain the leads of a replacement component therein.

25. The improvement of claim 24, and further comprising:
means for loading said replacement component into a particular position of said conveying means portion and for centering said replacement component about said midplane, said replacement component being substantially equivalent to a component preselected for said particular position.

26. The improvement of claim 23, and further comprising:
means for loading said replacement component into said particular position and for centering said replacement component about said midplane, said replacement component being substantially equivalent to a component preselected for said particular position.

27. The improvement of claimm 22, and further comprising:
means for testing electrical functioning of said components during said conveying and for flagging a particular position of said conveying means when a bad component corresponding to said particular position fails said testing in order that replacement of said bad component may be effected; and
means for loading said replacement component into said particular position and for centering said replacement component about said midplane, said replacement component being substantially equivalent to a component preselected for said particular position.

28. The improvement of claim 22, and further comprising:
means for opening and closing lead retaining clips of said conveying means portion in order to receive and retain the leads of a replacing component; and
means for testing electrical functioning of said replacing components.

29. The improvement of claim 25, wherein said loading and centering means comprises:
a loading assembly adjacent to and moveable toward and away from said path to provide operator access to said loading assembly and to said conveying means, and comprising said centering arms which open and close to center said bodies about a plane through said loading assembly, said arms also being pivotal about an axis generally perpendicular to said loading assembly plane in order to load a replacement component into said particular position by placing the leads of said replacement component into said lead retaining clips during opening thereof such that said plane substantially coincides with a midplane of said forming and inserting means.

30. The improvement of claim 29, and further comprising:
means for testing electrical functioning of each of said components while being held by a retainer clip and for providing an indication of a bad test result.

* * * * *